(12) United States Patent  
Natsume

(10) Patent No.: US 6,333,542 B2
(45) Date of Patent: *Dec. 25, 2001

(54) SEMICONDUCTOR DEVICE AND METHOD OF MANUFACTURING THE SAME

(75) Inventor: Hidetaka Natsume, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,261

(22) Filed: Apr. 30, 1999

(30) Foreign Application Priority Data

May 1, 1998 (JP) ................................. 10-122087

(51) Int. Cl.⁷ ................................................ H01L 29/76
(52) U.S. Cl. .................. 257/393; 257/903; 257/368; 257/379; 257/380; 257/536; 257/538
(58) Field of Search ................... 257/903, 393, 257/368, 379, 380, 528, 536, 538

(56) References Cited

U.S. PATENT DOCUMENTS

| | | | |
|---|---|---|---|
| 4,853,894 | * | 8/1989 | Yamanaka et al. ............... 365/154 |
| 5,240,872 | * | 8/1993 | Motonami et al. ................. 437/52 |
| 5,334,863 | * | 8/1994 | Ohkawa et al. .................... 257/69 |
| 5,436,506 | * | 7/1995 | Kim et al. ......................... 257/347 |
| 5,485,420 | * | 1/1996 | Lage et al. ........................ 365/154 |
| 5,545,584 | * | 8/1996 | Wuu et al. .......................... 437/52 |
| 5,751,050 | * | 5/1998 | Ishikawa et al. ................. 257/538 |
| 5,757,031 | * | 5/1998 | Natsume ............................ 257/67 |
| 5,780,909 | * | 7/1998 | Hayashi ............................ 257/393 |
| 5,811,858 | * | 9/1998 | Ohkubo ............................ 257/369 |
| 5,824,579 | * | 10/1998 | Subramanian et al. ........... 438/238 |
| 5,952,678 | * | 9/1999 | Ashida .............................. 257/67 |

FOREIGN PATENT DOCUMENTS

| | | | | |
|---|---|---|---|---|
| 522689A2 | * | 1/1993 | (EP) | ................... H01L/27/11 |
| 3-60068 | | 3/1991 | (JP) | . |
| 6-232372 | | 8/1994 | (JP) | . |
| 8-153805 | | 6/1996 | (JP) | . |
| 9-219494 | | 8/1997 | (JP) | . |

* cited by examiner

Primary Examiner—Eddie Lee
Assistant Examiner—Eugene Lee
(74) Attorney, Agent, or Firm—Sughrue Mion, PLLC

(57) ABSTRACT

An SRAM cell is arranged in a semiconductor device. A metal oxide semiconductor field effect transistor is arranged in the SRAM cell. An interlayer insulating film is formed on the metal oxide semiconductor field effect transistor. A load resistor conductive layer is formed on the interlayer insulating film. In addition, a wiring conductive layer which connects the gate electrode of the metal oxide semiconductor field effect transistor to the load resistor conductive layer is provided. The resistance of the wiring conductive layer is lower than the resistance of the load resistor conductive layer. A side wall is formed between the load resistor conductive layer and the wiring conductive layer.

21 Claims, 10 Drawing Sheets

SEMICONDUCTOR DEVICE AND METHOD OF MANUFACTURING THE SAME

BACKGROUND OF THE INVENTION

1. Field of the Invention

The present invention relates to a semiconductor device having an SRAM (Static Random Access Memory) cell being capable of securing high reliability and a method for manufacturing the same.

2. Description of the Related Art

As a method of decreasing an occupied area of a chip by an SRAM, a method of constituting a load resistor (resistance element) by a high-resistance polycrystalline silicon film having a high resistance exists. Such a SRAM cell is called a high-resistance polycrystalline silicon load resistor type cell. The resistance element constituted by a high-resistance polycrystalline silicon film is stacked on the upper layer of MOS transistors constituting the SRAM cell. In this manner, an occupied area by the SRAM is reduced.

FIG. 1 is an equivalent circuit diagram showing the arrangement of an SRAM cell. In the SRAM cell, a flip-flop connected between a power supply Vcc and a ground potential Vss is arranged. The flip-flop is constituted by driver transistors Tr1 and Tr2, load resistors R1 and R2, and a cross wirings. A connection point of one terminal of the load resistor R1, one terminal of the driver transistor Tr1, and the gate of the driver transistor Tr2 serves as a storage node Q1. Similarly, a connection point of one terminal of the load resistor R2, one terminal of the driver transistor Tr2, and the gate of the driver transistor Tr1 serves as a storage node Q2. When data are held in the SRAM cell, data "High" and data "Low" are stored in each of the storage nodes.

One terminal of an access transistor Tr3 is connected to the storage node Q1, and one terminal of an access transistor Tr4 is connected to the storage node Q2. A word line WL is connected to the gates of the access transistors Tr3 and Tr4. A bit line BL1 is connected to the other terminal of the access transistor Tr3, and a bit line BL2 is connected to the other terminal of the access transistor Tr4.

The resistance value of a supply portion of the power supply Vcc, the resistance value of the cross wiring between the storage node Q1 and the driver transistor Tr2, and the resistance value of the cross wiring between the storage node Q2 and the driver transistor Tr1 are preferably set to be approximately several KΩ/sq. or less to secure high reliability for the following reason. When the resistance value of the cross wirings exceeds the value described above, data transfer is delayed during data inversion of the memory cell, and a high-speed stable operation of the memory cell is hindered.

On the other hand, the load resistors R1 and R2 require resistances of about several GΩ to several TΩ or more because the SRAM cell is demanded to have a low power consumption. For example, when data "High" is stored in the storage node Q1, the driver transistor Tr2 is set in an ON state, and a through current flows from the power supply Vcc to the ground potential Vss through the load resistor R2 and the driver transistor Tr2. At this time, when the resistance value of the load resistor R2 is lower than the required resistance value, an excessive current flows from the power supply Vcc to the ground potential Vss as a standby current. Therefore, a power consumption of the SRAM increases. A similar operation is also performed when the data "High" is stored in the storage node Q2. For this reason, the load resistors R1 and R2 require extremely high resistances.

The high-resistance polycrystalline silicon load resistor type cell is disclosed in, for example, Japanese Patent Application Laid-Open No. 9-219494. FIG. 2 is a sectional view showing a conventional semiconductor device described in Japanese Patent Application Laid-Open No. 9-219494.

A field oxide film 202 functioning as an element isolation region is formed at the surface of a semiconductor substrate 201. A gate oxide film 203 is formed on the semiconductor substrate 201. The field oxide film 202 and the gate oxide film 203 are shown as the same layer for descriptive convenience. A channel region is formed at the surface of the semiconductor substrate 201 below the gate oxide film 203. Source-drain regions (not shown) are formed on both the side portions of the channel region. A gate electrode 204 is formed on the gate oxide film 203. A driver MOS transistor having the gate electrode 204, the gate oxide film 203, the channel region, and the source-drain regions is formed.

In addition, in a region, at the surface of the semiconductor substrate 201, in which the gate electrode 204 is not formed, an $N^+$-diffusion layer 207, which is one of source-drain regions of an access MOS transistor, is selectively formed. An interlayer insulating film 208 in which a common contact hole 209 is provided is formed on the entire surface of the resultant structure. The common contact hole 209 is formed in a region corresponding to any one of the storage nodes of the SRAM cell. A pad polycrystalline silicon layer 210 is formed in the common contact hole 209 and selectively on the interlayer insulating film 208. The pad polycrystalline silicon layer 210 is constituted by a low-resistance polycrystalline silicon film. The pad polycrystalline silicon layer 210 is formed in a region corresponding to the storage node and the cross wiring between the storage node and the driver transistor connected thereto. A resistance polycrystalline silicon layer 212 is selectively formed on the pad polycrystalline silicon layer 210 and the interlayer insulating film 208. The resistance polycrystalline silicon layer 212 is constituted by a high-resistance polycrystalline silicon film. The resistance polycrystalline silicon layer 212 is formed in a region corresponding to a resistance element formed on the MOS transistor, i.e., a load resistor.

Of the resistance polycrystalline silicon layer 212, a portion directly formed on the interlayer insulating film 208 on the MOS transistor functions as the high-resistance load resistor. The length of the portion is called a resistor length. As the resistor length increases, the resistance of the load resistor in the SRAM cell increases.

The SRAM cell is manufactured in the following manner. FIGS. 3A to 3F are sectional views sequentially showing the steps in a method of manufacturing the conventional semiconductor device.

As shown in FIG. 3A, the field oxide film (silicon oxide film) 202 serving as an element separation region is formed at the surface of the semiconductor substrate 201. A silicon oxide film and a tungsten polycide film are sequentially stacked. These films are patterned to form the gate oxide film 203 and the gate electrode 204. The $N^+$-diffusion layer 207 serving as an impurity diffusion layer of an access transistor is selectively formed at the surface of the semiconductor substrate 201. At this time, source-drain regions (not shown) of a driver transistor are formed.

Thereafter, as shown in FIG. 3B, the interlayer insulating film 208 is formed on the entire surface of the resultant structure, and a mask for opening a contact hole is formed on the interlayer insulating film 208 by a resist 241. The common contact hole 209 is formed in the interlayer insulating film 208, and the resist 241 is removed.

Thereafter, as shown in FIG. 3C, the pad polycrystalline silicon layer 210 constituted by a low-resistance polycrystalline silicon film is formed on the entire surface of the resultant structure. In addition, a resist 242 having a predetermined shape is formed on the pad polycrystalline silicon layer 210. In general, an impurity is implanted in the pad polycrystalline silicon layer 210 at a high concentration to reduce the resistance thereof.

Thereafter, the pad polycrystalline silicon layer 210 is etched by using the resist 242 as a patterning mask. Then, as shown in FIG. 3D, the resist 242 is removed.

Thereafter, as shown in FIG. 3E, the resistance polycrystalline silicon layer 212 constituted by a high-resistance polycrystalline silicon film is formed, and a resist 243 having a predetermined shape is formed on the resistance polycrystalline silicon layer 212.

Thereafter, the end portion of the resistance polycrystalline silicon layer 212 is etched by using the resist 243 as a mask. With the steps, as shown in FIG. 3F, an SRAM cell having the structure shown in FIG. 2 can be obtained.

However, since an impurity is implanted in the pad polycrystalline silicon layer 210 at a high concentration to reduce the resistance, the impurity implanted in the pad polycrystalline silicon layer 210 tends to be diffused in a portion of the resistance polycrystalline silicon layer 212 being in contact with the pad polycrystalline silicon layer 210. FIG. 4 is a sectional view showing diffusion of an impurity in a conventional semiconductor device. As indicated by arrows in FIG. 4, the impurity is diffused from the end portion of the pad polycrystalline silicon layer 210 into the resistance polycrystalline silicon layer.

For securing a high resistance value, an amount of impurity implanted in the resistance polycrystalline silicon layer 212 is considerably lower than an amount of impurity implanted in the pad polycrystalline silicon layer 210. Therefore, a high-resistance portion in the resistance polycrystalline silicon layer 212 is shortened by the impurity diffused from the upper and side surfaces of the pad polycrystalline silicon layer 210. As a result, as shown in FIG. 4, although a resistor length L1 is originally supported, a resistor length L2 is actually obtained. More specifically, the resistor length is smaller than the predicted length.

Therefore, in the SRAM cell of the prior art described above, since the resistance of the load resistor is lower than the desired one, a problem is posed from the viewpoint of a reduction in power consumption.

There is a semiconductor device in which a common contact hole having a different shape is formed. FIG. 5 is a sectional view showing a conventional semiconductor device in which the opening portion of a common contact hole is located immediately above a diffusion layer. In this conventional semiconductor device, as in the semiconductor device described above, a semiconductor substrate 301, a field oxide film 302, a gate oxide film 303, a gate electrode 304, an $N^+$-display layer 307, an interlayer insulating film 308, a pad polycrystalline silicon layer 310, and a resistance polycrystalline silicon layer 312 are provided. In a common contact hole 309 provided in the interlayer insulating film 308, the lower end of the opening portion is located immediately above the $N^+$-display layer 307.

Even in the conventional semiconductor device arranged as described above, similarly, an impurity is diffused from the upper and side surfaces of the pad polycrystalline silicon layer 310 into the resistance polycrystalline silicon layer 312. Therefore, due to diffusion of the impurity, the high-resistance portion in the resistance polycrystalline silicon layer 312 is disadvantageously shorter than the high-resistance portion which is originally supposed.

The second conventional semiconductor device also has a problem on manufacturing. For example, when an alignment error to the common contact hole 309 occurs in the resist used for patterning the resistance polycrystalline silicon layer 312, the semiconductor substrate 301 may be etched.

FIG. 6 is a sectional view showing an inconvenience caused by an alignment error. For example, assuming that a resist 313 is formed near an error position shown in FIG. 6, when etching is performed by using the resist 313 as a mask, the resistance polycrystalline silicon layer 312 and the pad polycrystalline silicon layer 310 are etched in the common contact hole 309 along one side surface of the resist 313. It is generally known that, when etching is performed, over-etching is performed in consideration of variations in process.

For this reason, when the alignment error of the resist 313 occurs, as shown in FIG. 6, the semiconductor substrate 301 is etched by over-etching. When the semiconductor substrate 301 immediately below the common contact hole 309 is etched, since a portion near the etched portion corresponds to a storage node of the SRAM cell, leakage is caused by damage of the substrate and such, and a serious problem that the stored data is broken is posed. Therefore, in such a case, the yield decreases.

SUMMARY OF THE INVENTION

It is an object of the present invention to provide a semiconductor device having an SRAM cell being capable of securing a resistance value which is sufficient for a load resistor and, preferably, being capable of preventing a yield from decreasing, and a method for manufacturing the same.

According to one aspect of the present invention, a semiconductor device comprises a static random access memory cell. The static random access memory cell may have a metal oxide semiconductor field effect transistor, an interlayer insulating film formed on the metal oxide semiconductor field effect transistor, a load resistor conductive layer formed on the interlayer insulating film, a wiring conductive layer which connects a gate electrode of the metal oxide semiconductor field effect transistor to the load resistor conductive layer, and a side wall formed between the load resistor conductive layer and the wiring conductive layer. The resistance of the wiring conductive layer may lower than the resistance of the load resistor conductive layer.

According to the present invention, since the side wall is formed between the high-resistance load resistor conductive layer and the low-resistor wiring conductive layer, an impurity is prevented by the side wall from being diffused from the low-resistance wiring conductive layer to a portion, of the high-resistance load resistor conductive layer, serving as the load resistor of the SRAM cell.

According to another aspect of the present invention, a method of manufacturing a semiconductor device may comprise the steps of forming a metal oxide semiconductor field effect transistor on a semiconductor substrate, forming an interlayer insulating film on the metal oxide semiconductor field effect transistor, opening a contact hole to which a gate electrode of the metal oxide semiconductor field effect transistor is exposed in the interlayer insulating film, and forming a wiring conductive layer along an inner surface of the contact hole. The wiring conductive layer is in contact with the gate electrode and extending to an upper surface of the interlayer insulating film. The method of manufacturing a semiconductor device may further comprise the steps of forming a side wall on a side surface of the wiring conductive layer, and forming a load resistor conductive layer which is in contact with an upper surface of the wiring conductive layer on the interlayer insulating film. The resistance of the load resistor conductive layer is higher than the resistance of the wiring conductive layer.

According to the present invention, since the side wall may be formed on the side surface of the wiring conductive layer even in the contact hole, even if an alignment error occurs in a resist used to form the high-resistance load resistor conductive layer, the side wall functions as an etching stopper. Therefore, the semiconductor substrate is prevented from being etched. A storage node is prevented from being broken. As a result, a yield increases.

DETAILED DESCRIPTION OF THE PREFERRED EMBODIMENTS

Figure 7:
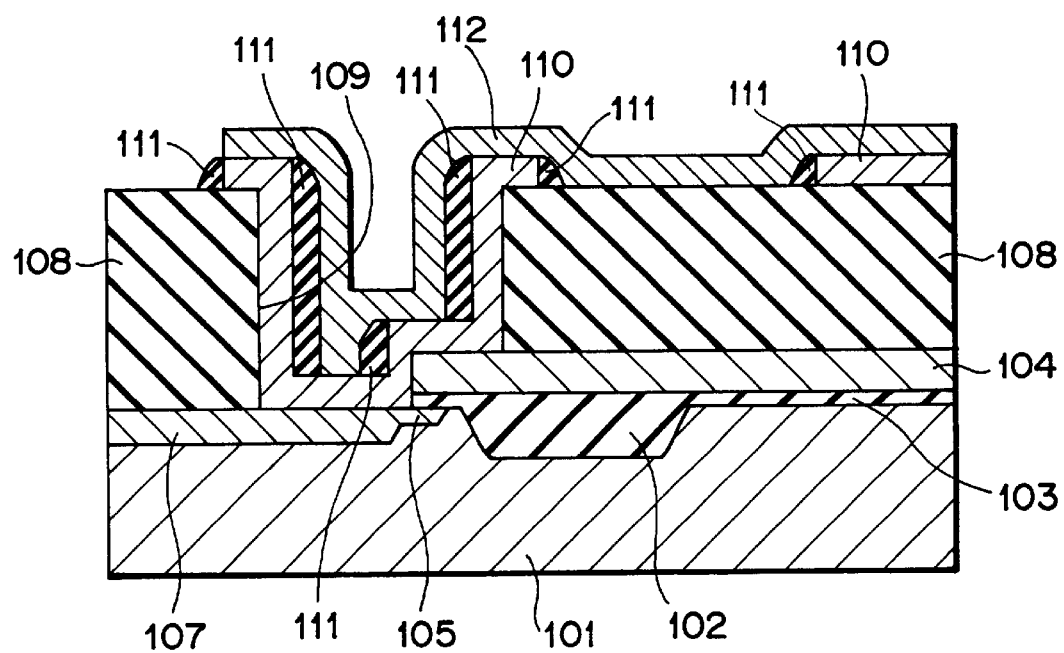
FIG. 7 is a sectional view showing a semiconductor device according to a first embodiment of the present invention.

Semiconductor devices according to the embodiments of the present invention will be described below with reference to the accompanying drawings. FIG. 7 is a sectional view showing a semiconductor device according to a first embodiment of the present invention.

In the first embodiment, a field oxide film 102 serving as an element isolation region is formed at the surface of a semiconductor substrate 101. A gate oxide film 103 is formed on the semiconductor substrate 101. The field oxide film 102 and the gate oxide film 103 are shown as the same layer for descriptive convenience in FIG. 7. A channel region is formed at the surface of the semiconductor substrate 101 below the gate oxide film 103. Source-drain regions (not shown) are formed on both the side portions of the channel region. A gate electrode 104 is formed on the gate oxide film 103. A driver MOS transistor having the gate electrode 104, the gate oxide film 103, the channel region, and the source-drain regions is formed.

In addition, in a region, at the surface of the semiconductor substrate 101, in which the gate electrode 104 is not formed, an N$^+$-diffusion layer 107 is selectively formed. An N$^-$-diffusion layer 105 is formed between the N$^+$diffusion layer 107 and the gate electrode 104. The N$^+$-diffusion layer 107 and the N$^-$-diffusion layer 105 are one of source-drain regions of an access MOS transistor. An interlayer insulating film 108 in which a common contact hole 109 is formed on the entire surface of the resultant structure. The common contact hole 109 is formed in a region corresponding to any one of the storage nodes Q1 and Q2 of the SRAM cell. A pad polycrystalline silicon layer 110 is formed in the common contact hole 109 and on selectively the interlayer insulating film 108. The pad polycrystalline silicon layer 110 may comprise, for example, a low-resistance polycrystalline silicon film. The pad polycrystalline silicon layer 110 is formed in a region corresponding to the storage node Q1 or Q2 and the cross wiring between the storage node Q1 or Q2 and the driver transistor Tr2 or Tr1 connected thereto. The resistance of the pad polycrystalline silicon layer 110 is preferably set to be approximately several KΩ/sq. or less.

A side wall 111 is formed on the entire side surface of the pad polycrystalline silicon layer 110. A resistance polycrystalline silicon layer 112 is selectively formed on the pad polycrystalline silicon layer 110 and the interlayer insulating film 108. The resistance polycrystalline silicon layer 112 may comprise, for example, a high-resistance polycrystalline silicon layer. The resistance polycrystalline silicon layer 112 is formed in a region corresponding to the resistance element formed on the MOS transistor, i.e., a load resistor R1 or R2. The length of a portion sandwiched by the two pad polycrystalline silicon layers 110 of the resistance polycrystalline silicon layer 112 is preferably set to be as large as possible to secure a sufficient resistance.

A method of manufacturing the semiconductor device according to the first embodiment will be described below. FIGS. 8A to 8I are sectional views sequentially showing the steps in a method of manufacturing a semiconductor device according to the first embodiment.

Figure 8A:
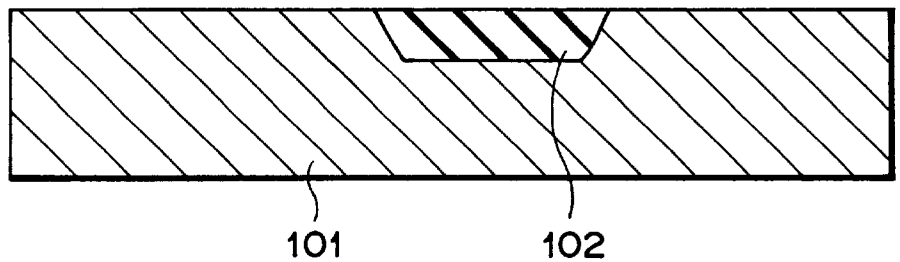
FIGS. 8A to 8I are sectional views sequentially showing the steps in a method of manufacturing a semiconductor device according to the first embodiment.

As shown in FIG. 8A, the field oxide film (silicon oxide film) 102 serving as an element isolation region is formed at the surface of the semiconductor substrate 101, for example, by a selective oxidation method. The thickness of the field oxide film is, for example, 2,000 to 5,000 Å.

Figure 8B:
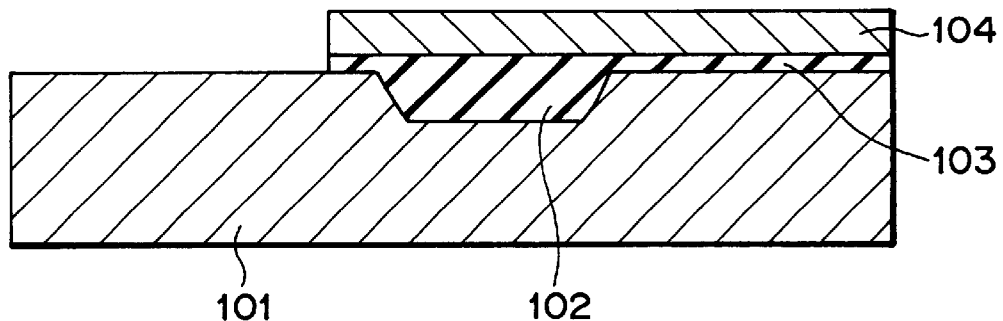

A silicon oxide film and a conductive film are sequentially stacked on the entire surface of the resultant structure. These films are processed to have a predetermined shape, so that the gate oxide film 103 and the gate electrode 104 are formed, as shown in FIG. 8B. The silicon oxide film can be formed by a known method. The thickness of the silicon oxide film is, for example, 60 to 100 Å. The conductive film may have, for example, a polycrystalline silicon film, and formed, for example, by a CVD method or a similar method. The thickness of the conductive film is, for example, 2,000 to 3,000 Å. The oxide film and the conductive film can be processed by a known method to have desired shapes. The conductive film (gate electrode 104) may have not only a polycrystalline silicon film, but also a polycrystalline silicon (DOPOS) film added with an impurity such as phosphorus. The conductive film (gate electrode 104) may have a laminate (polycide) film obtained by stacking a polycrystalline silicon film and a composite (silicide) film of a refractory metal such as titanium or tungsten and silicon.

Figure 8C:
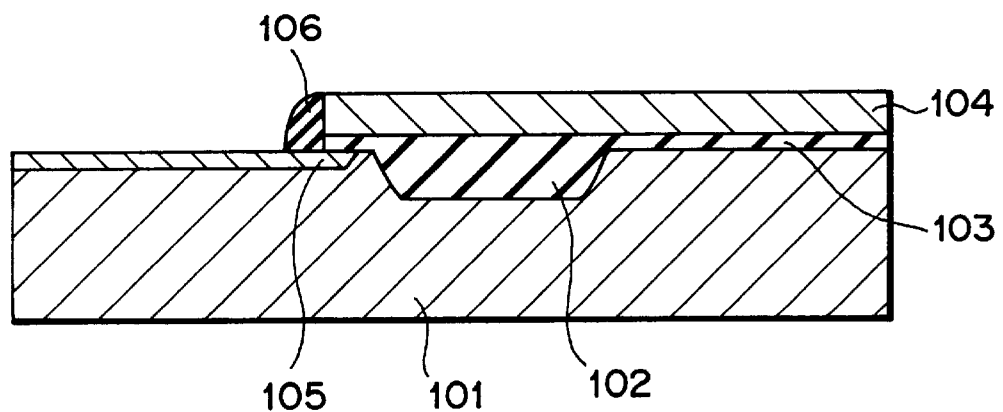

As shown in FIG. 8C, ion implantation is performed to the surface of the semiconductor substrate 101 by using the gate electrode 104 as a mask. In this manner, the N$^-$-diffusion layer 105 is formed as an impurity diffusion layer. A provisional side wall 106 is formed on the side surfaces of the gate oxide film 103 and the gate electrode 104 on the N⁻-diffusion layer 105 side. The N⁻-diffusion layer 105 may be formed by ion-implanting phosphorous or arsenic or both of them at a concentration of, for example, about $1 \times 10^{13}$ cm$^{-2}$. The provisional side wall 106 can be formed such that an oxide film having a thickness of about 1,000 to 2,000 Å is formed by a CVD method or a similar method and subjected to anisotropic etching.

Figure 8D:
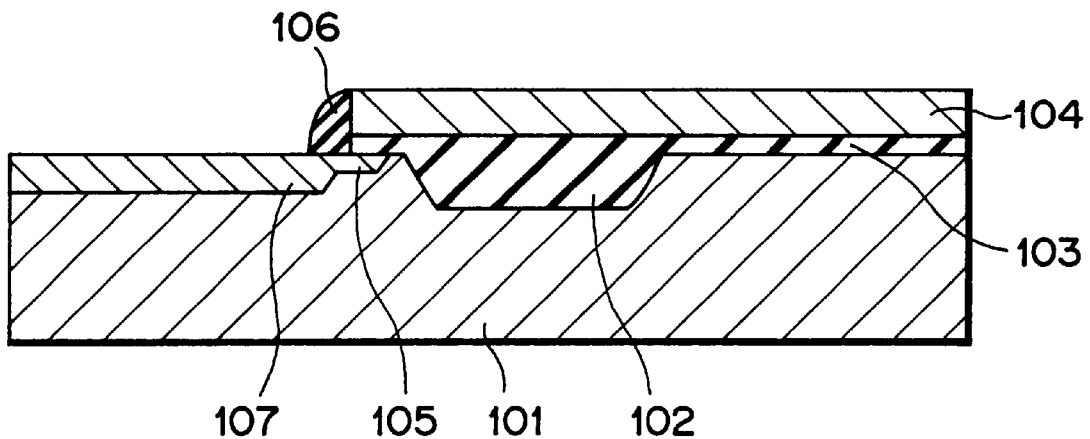

Thereafter, ion implantation is performed by using the provisional side wall 106 and the gate electrode 104 as a mask, as shown in FIG. 8D, so that the N⁺-diffusion layer 107 is formed at the surface of the semiconductor substrate 101. The N⁺-diffusion layer 107 can be formed by implanting arsenic at a concentration of, for example, $1 \times 10^{15}$ cm$^{-2}$. Source-drain regions (not shown) of a driver MOS transistor are formed at the surface of the semiconductor substrate 101 at the same time as the diffusion layers 105 and 107 are formed.

Figure 8E:
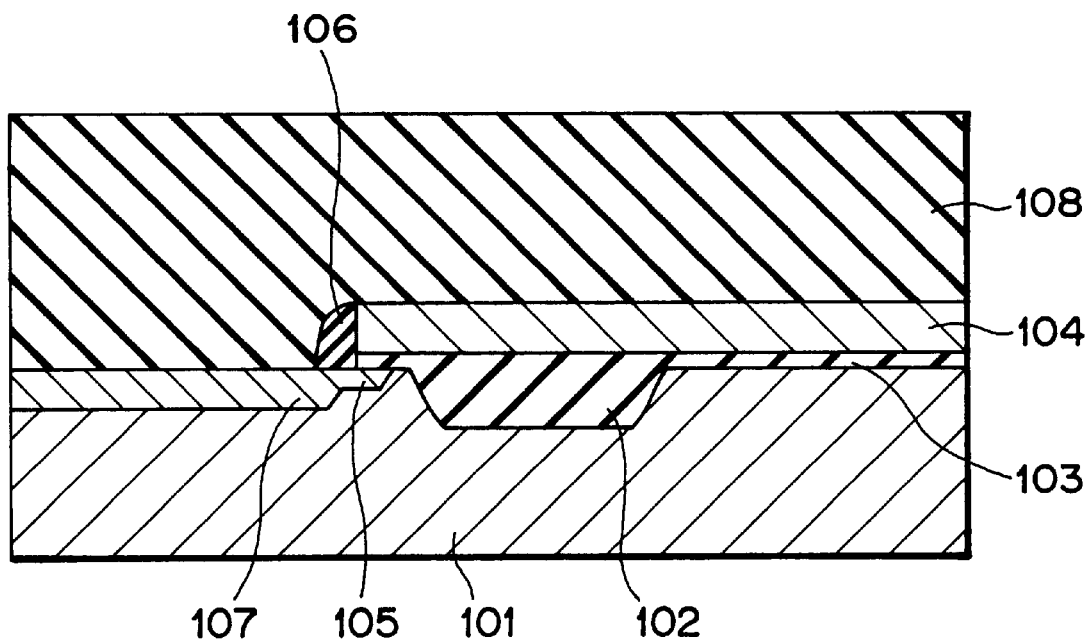

Thereafter, as shown in FIG. 8E, the interlayer insulating film 108 is formed on the entire surface of the resultant structure by a CVD method or a similar method. The interlayering film 108 may include by a silica glass (BPSG) film added with boron or phosphorus or a similar film. The thickness of the interlayer insulating film 108 is, for example, about 3,000 to 6,000 Å. The interlayer insulating film 108 can also be formed by performing a reflow process to a BPSG film. The interlayer insulating film 108 may be a laminate film including an oxide film and a BPSG reflow-film. In addition, the interlayer insulating film 108 may be also formed such that an oxide film having a predetermined thickness is formed and decreased in thickness by, for example, a CMP method or a similar method.

Figure 8F:
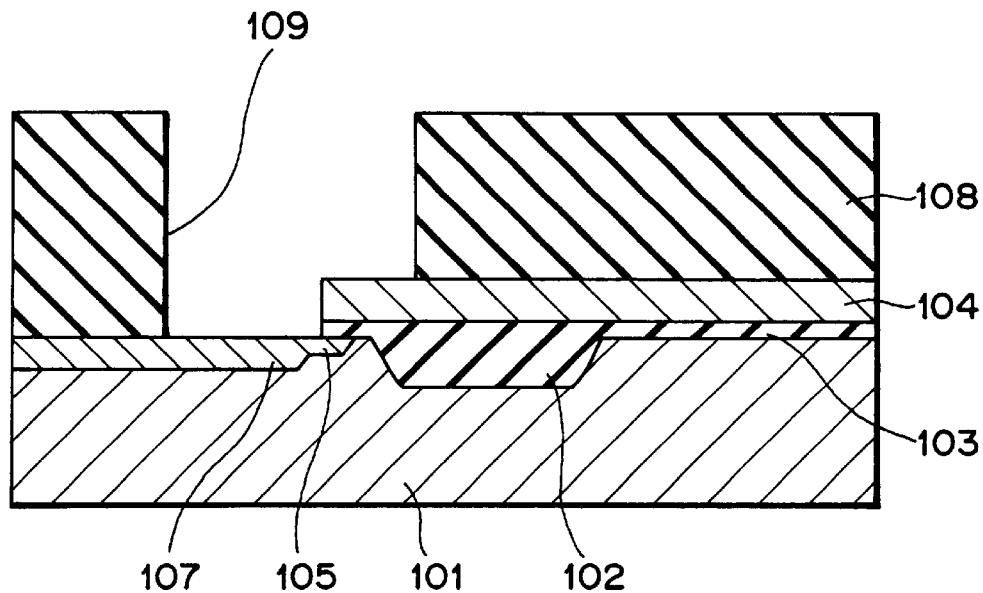

As shown in FIG. 8F, the common contact hole 109 is opened in a region extending from the gate electrode 104 to the N⁺-diffusion layer 107 and near the region of the interlayer insulating film 108, and the provisional side wall 106 is removed.

Figure 8G:
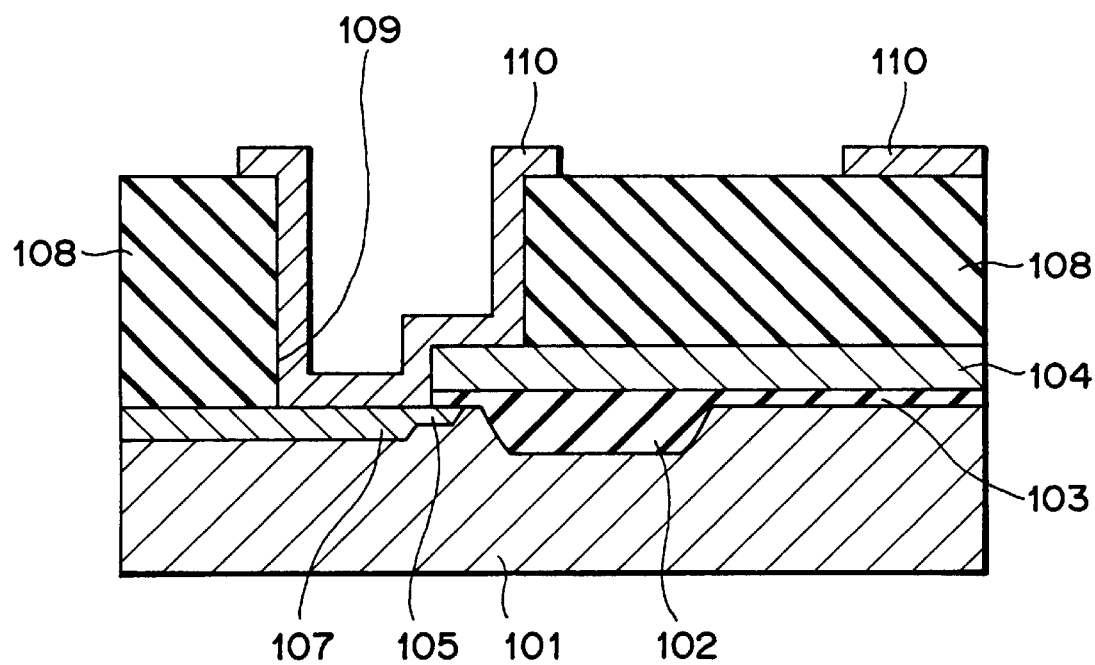

As shown in FIG. 8G, the pad polycrystalline silicon layer 110 which covers the bottom and side surfaces of the common contact hole 109 and is patterned to have a desired shape is formed. The thickness of the pad polycrystalline silicon layer 110 is desirably, for example, about 300 to 2,000 Å. The pad polycrystalline silicon layer 110 can be formed such that an impurity such as phosphorus is implanted at a concentration of about $1 \times 10^{15}$ cm$^{-2}$ in a polycrystalline silicon film grown by, for example, a CVD method or a similar method. The pad polycrystalline silicon layer 110 may have a polycrystalline silicon (DOPOS) film added with an impurity such as phosphorus.

Figure 8H:
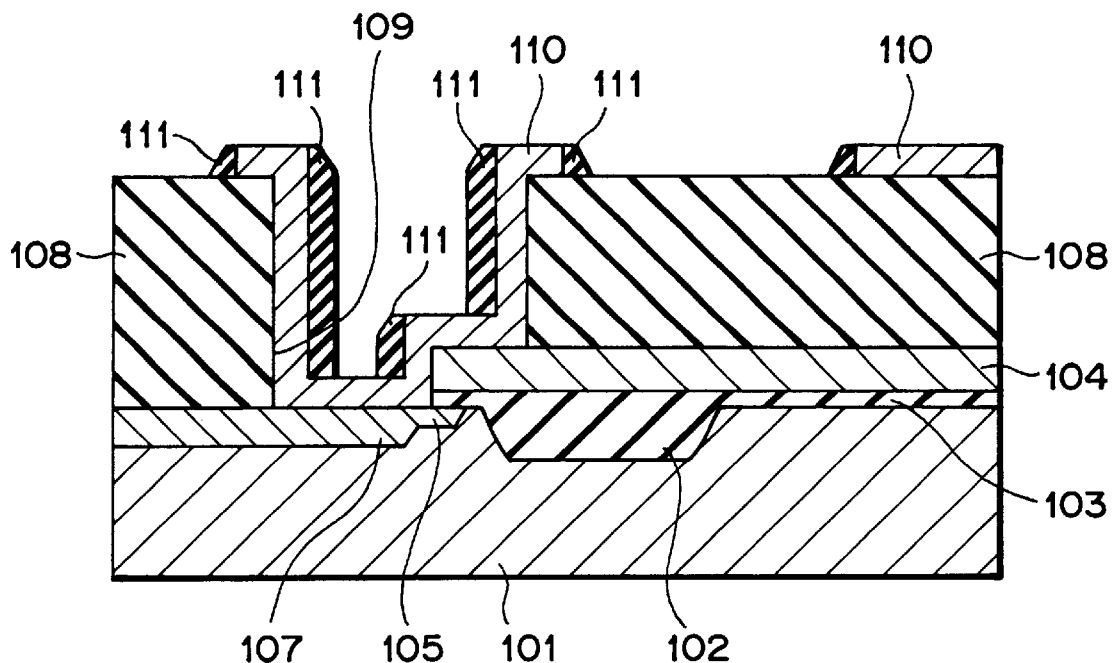

As shown in FIG. 8H, the side wall 111 is formed on the entire side surface of the pad polycrystalline silicon layer 110. The thickness of the side wall 111 is, for example, about 300 to 2,000 Å. The side wall 111 can be formed such that, for example, an oxide film having the thickness described above is formed by a CVD method or a similar method and subjected to anisotropic etching.

The side wall formed between the pad polycrystalline silicon layers 110 formed at two portions on the interlayer insulating film 108 is called a resistor length securing side wall. The resistor length securing side wall prevents a high-resistance polycrystalline silicon film to be described later from being in contact with the pad polycrystalline silicon layer 110. For this reason, impurity diffusion from the pad polycrystalline silicon layer 110 to the high-resistance polycrystalline silicon film is suppressed, and the resistor length of the load resistor is secured.

The side wall formed in the common contact hole 109 is called a stopper side wall. This stopper side wall functions as an etching stopper when an alignment error of a resist film occurs in the following etching step. For this reason, the semiconductor substrate 101 is prevented from being etched.

Figure 8I:
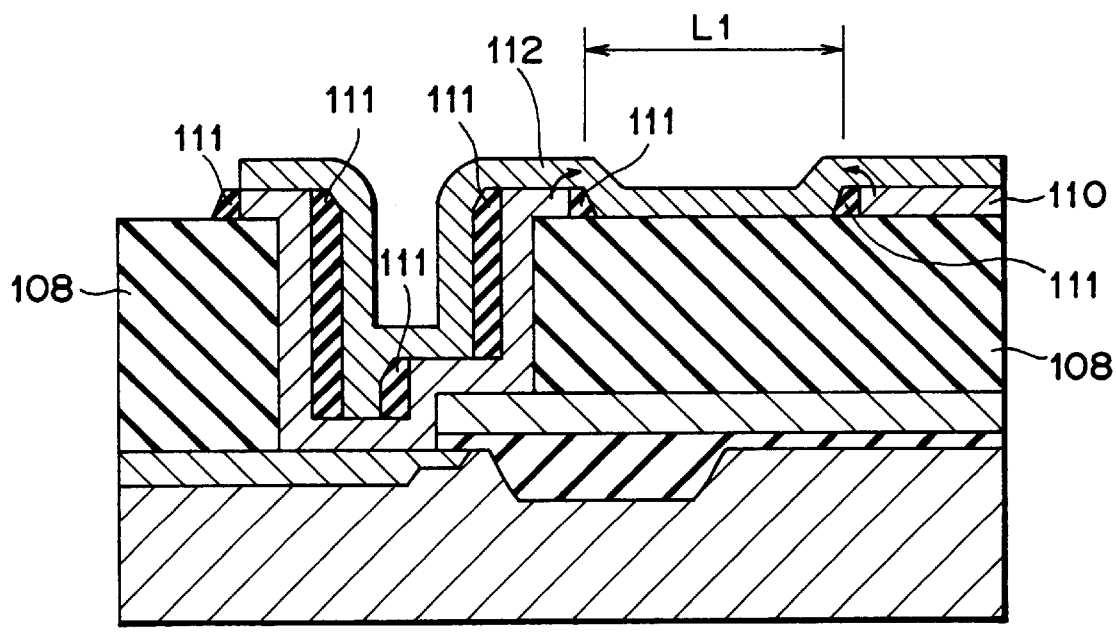

An SIPOS film (Semi Insulated Poly-Silicon film) or a polycrystalline silicon film having a thickness of, for example, about 300 to 2,000 Å is formed by a CVD method or a similar method. An impurity such as phosphorus is implanted at a concentration of, for example, about $1 \times 10^{13}$ cm$^{-2}$ to $1'10^{14}$ cm$^{-2}$ to adjust the resistance value of the SIPOS film or the polycrystalline silicon film. The resistance value is at least higher than that of the pad polycrystalline silicon layer 110. When the SIPOS film or the polycrystalline silicon film is patterned by a known method to have a desired shape, as shown in FIG. 8I, the resistance polycrystalline silicon layer 112 for connecting the pad polycrystalline silicon layers 110 formed at two portions to each other.

Thereafter, an interlayer insulating film (not shown) is formed and subjected to predetermined thermal treatment and to form a wiring layer (not shown) including a contact and a bit line and a passivation film (not shown). With the steps described above, an SRAM cell having the structure shown in FIG. 7 is obtained.

Although the memory cell has an n-channel MOS transistor, peripheral circuits also include not only an n-channel MOS transistor but also a p-channel MOS transistor. Although the p-channel MOS transistor is different from the N-channel MOS transistor in impurity type and such, the p-channel MOS transistor can be formed by a similar method as that of the n-channel MOS transistor.

According to a semiconductor device according to the first embodiment comprising the SRAM formed as described above, a power consumption can be advantageously reduced, and a semiconductor substrate can be advantageously prevented from etched by an alignment error.

In the first embodiment, as shown in FIG. 8I, the side wall 111 serves as a resistor length securing side wall. More specifically, on the interlayer insulating film 108, the side wall 111 is interposed between the low-resistance pad polycrystalline silicon layer 110 and the high-resistance resistance polycrystalline silicon layer 112. For this reason, as indicated by arrows, impurity diffusion from the upper surface of the pad polycrystalline silicon layer 110 to the resistance polycrystalline silicon layer 112 may occur. However, lateral impurity diffusion from the side surface of the pad polycrystalline silicon layer 110 to the resistance polycrystalline silicon layer 112 is suppressed. Thus, in the first embodiment, a desired resistor length is represented by L1, and a resistor length which is actually obtained is substantially L1.

Figure 1:
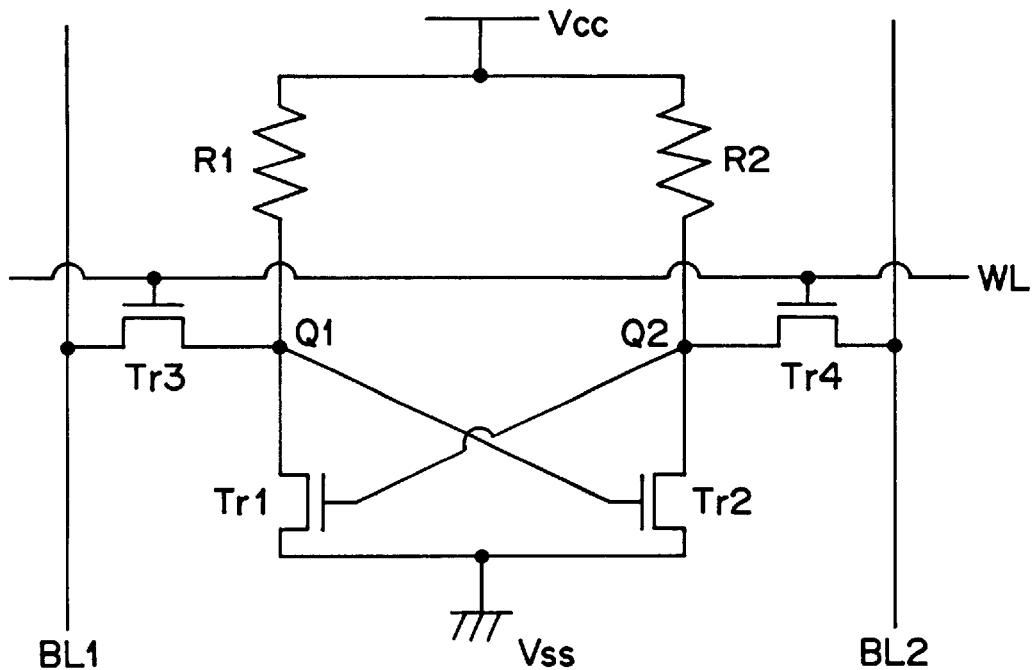
FIG. 1 is an equivalent circuit diagram showing the arrangement of an SRAM cell.
Figure 2:
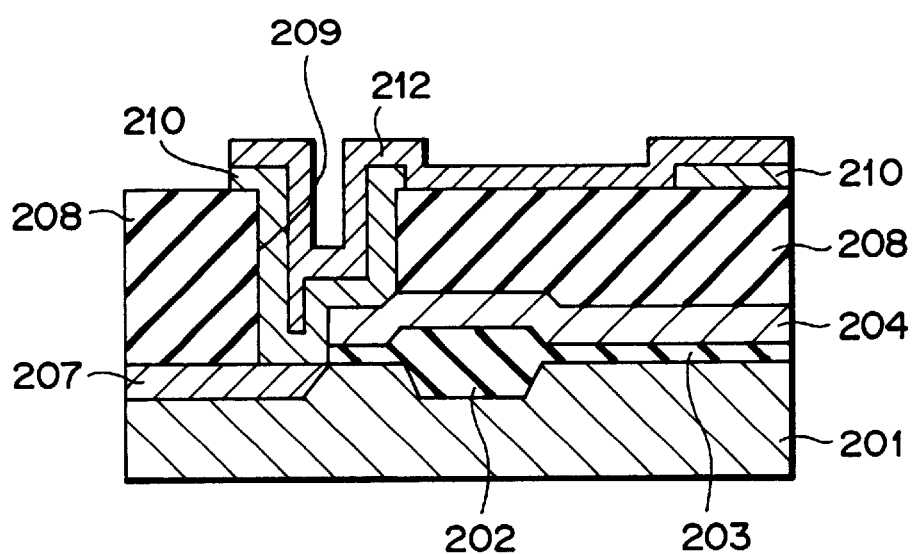
FIG. 2 is a sectional view showing a conventional semiconductor device described in Japanese Patent Application Laid-Open No. 9-219494.
Figure 3A:
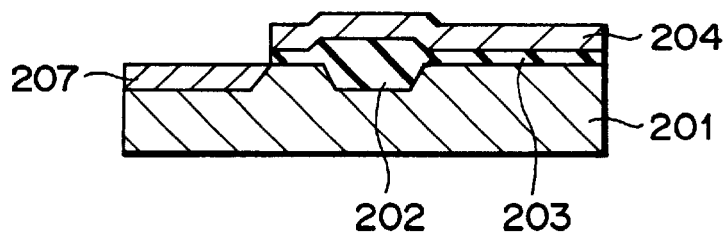
FIGS. 3A to 3F are sectional views sequentially showing the steps in a method of manufacturing a conventional semiconductor device.
Figure 3B:
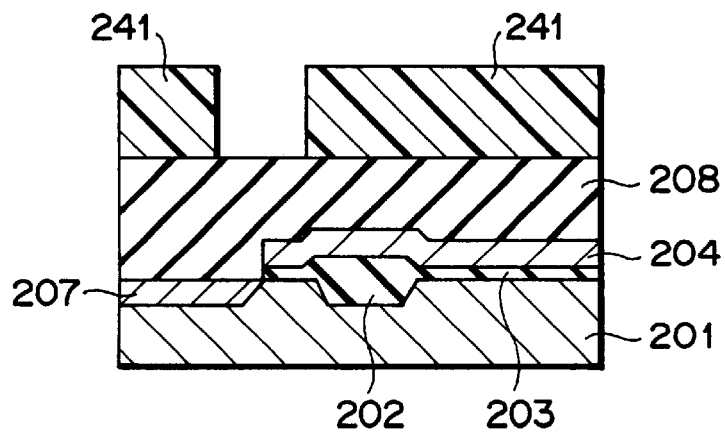
Figure 3C:
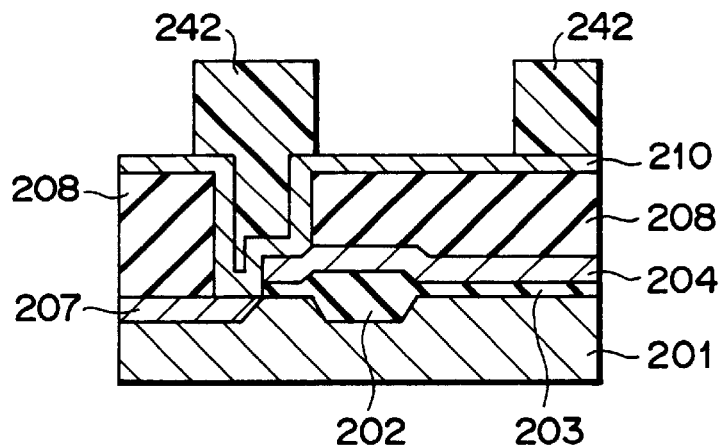
Figure 3D:
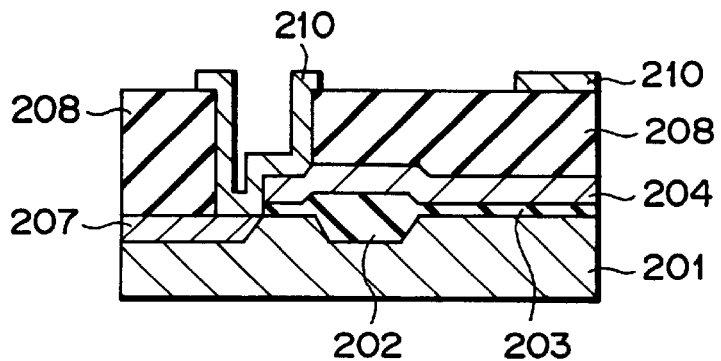
Figure 3E:
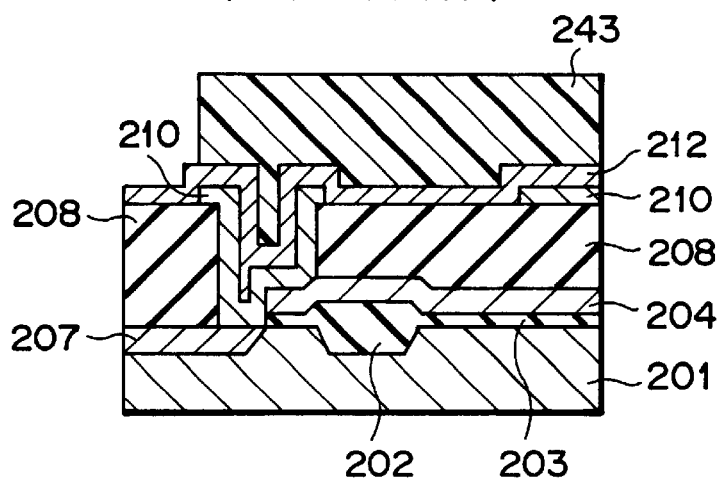
Figure 3F:
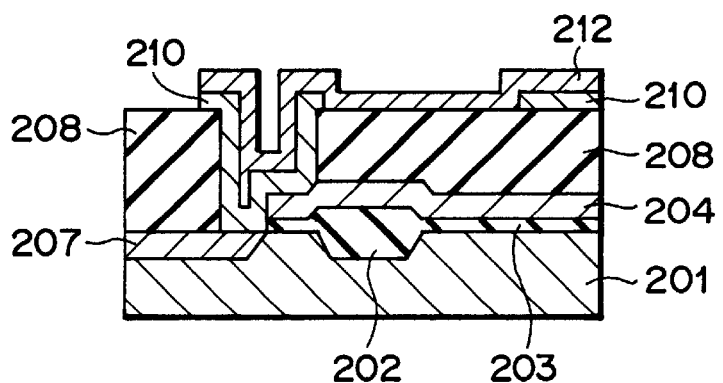
Figure 4:
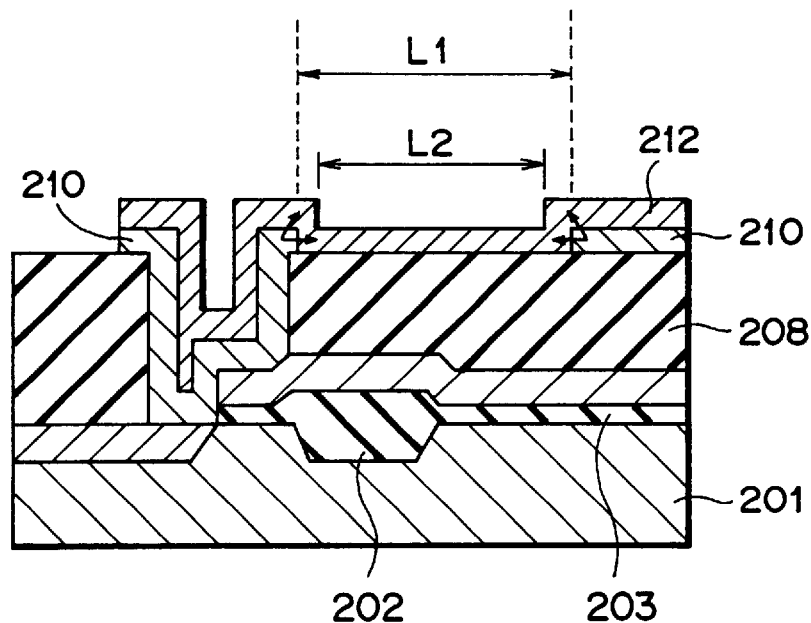
FIG. 4 is a sectional view showing diffusion of an impurity in a conventional semiconductor device.
Figure 5:
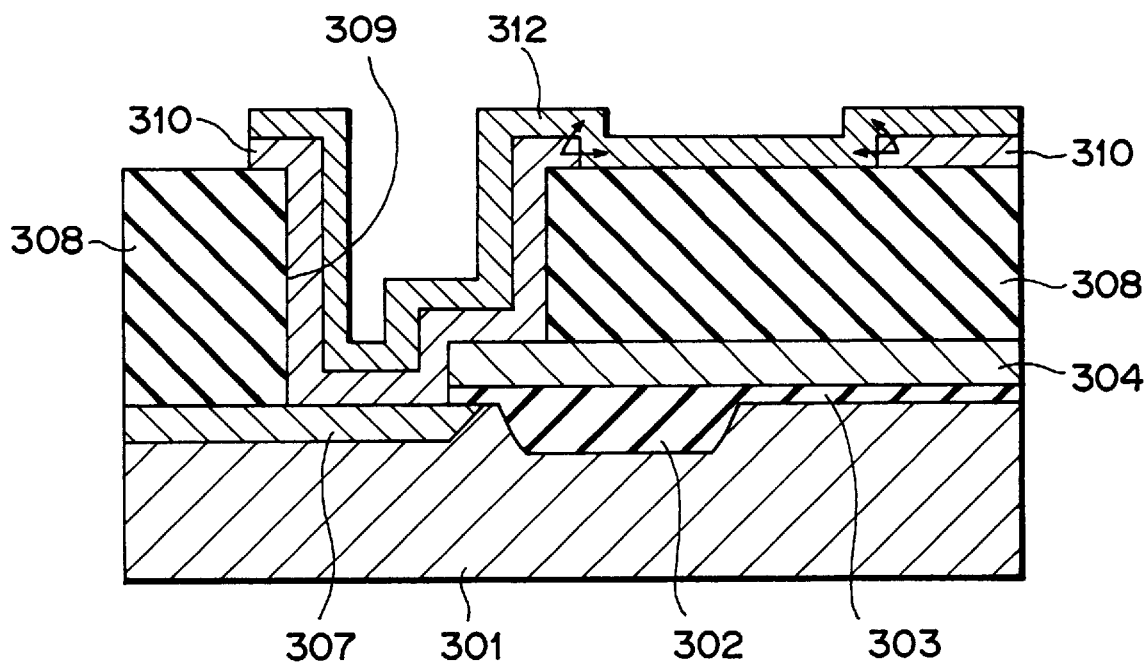
FIG. 5 is a sectional view showing a conventional semiconductor device in which an opening portion of a common contact hole is located immediately above a diffusion layer.
Figure 6:
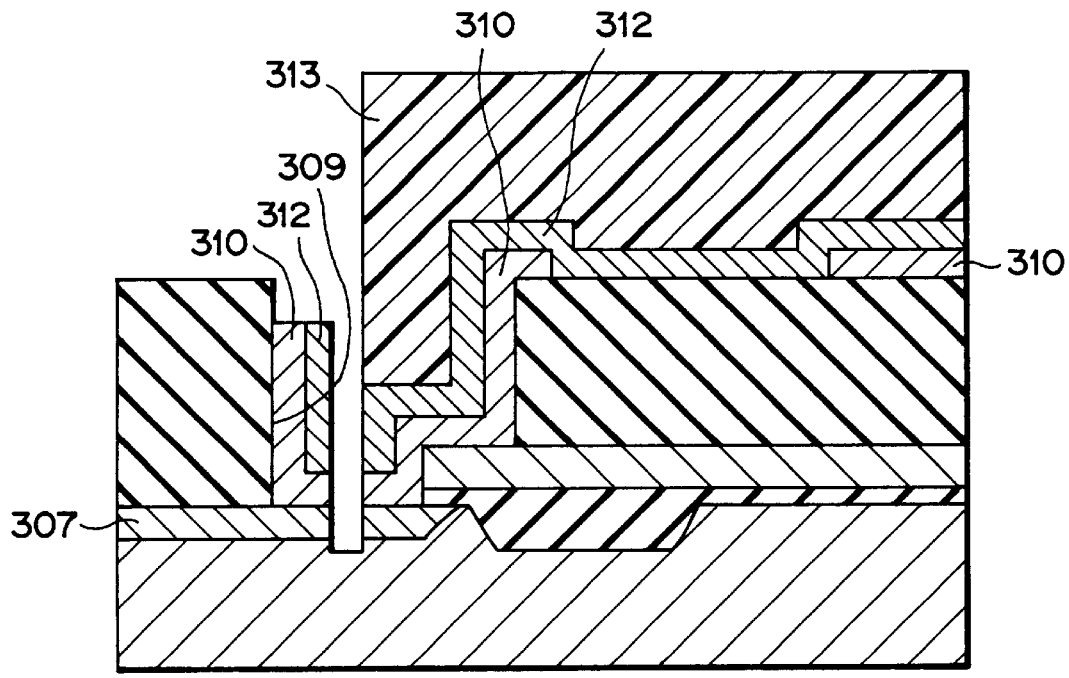
FIG. 6 is a sectional view showing an inconvenience caused by an alignment error.

On the other hand, in a conventional semiconductor device, as shown in FIG. 4 or FIG. 5, on the interlayer insulating film, the pad polycrystalline silicon layer and the resistance polycrystalline silicon layer are in direct contact with each other in a lateral direction. For this reason, lateral impurity diffusion from the side surface of the pad polycrystalline silicon layer to the resistance polycrystalline silicon layer occurs. As a result, the obtained resistor length is shorter than the desired resistor length.

The resistance value depending on the length of the resistance polycrystalline silicon layer, as described above, is an important parameter on the characteristics of the SRAM. For this reason, a value which is equal to or larger than the desired resistance value is required. As in the conventional semiconductor, when an amount of lateral impurity diffusion from the pad polycrystalline silicon layer is large, the resistor length decreases. Influence of the impurity diffusion on the resistance increases. Therefore, the resistance value easily varies. For this reason, in the conventional semiconductor device, an SRAM having stable characteristics cannot be obtained. In contrast to this, according to the first embodiment, a high-resistance polycrystalline silicon film load type SRAM cell having a desired resistor length. For this reason, influence by the conventional impurity diffusion is reduced. As a result, an SRAM having stable characteristics can be obtained.

Figure 9:
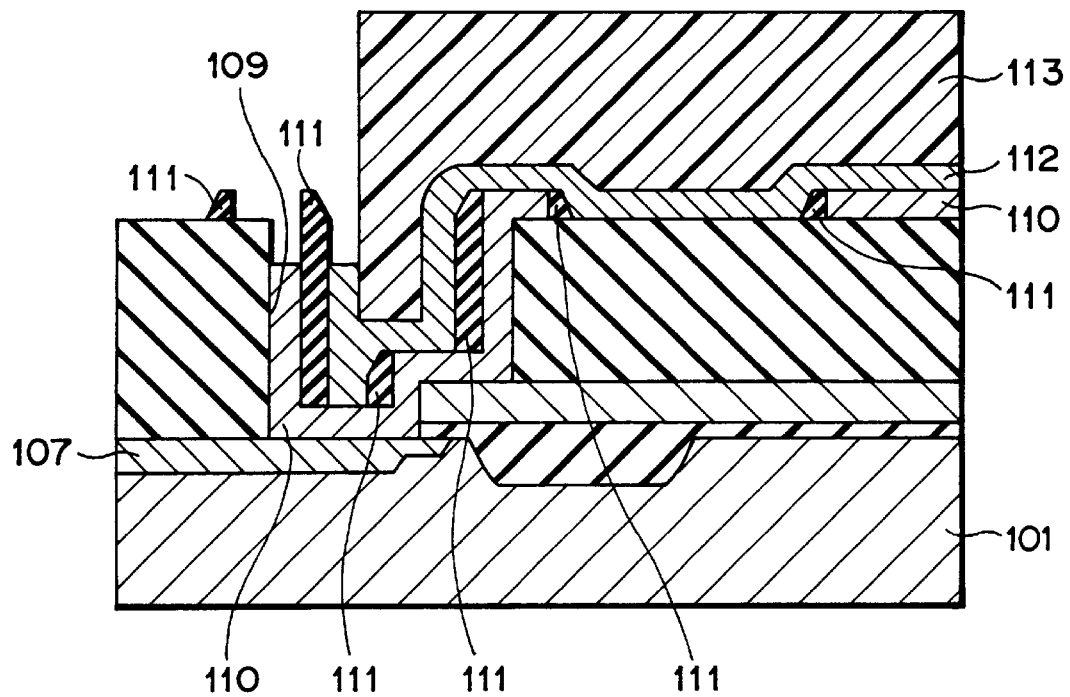
FIG. 9 is a sectional view showing a state in which an alignment error occurs.

According to a semiconductor device according to the first embodiment described above, a semiconductor substrate is prevented from being etched by an alignment error. FIG. 9 is a sectional view showing a state in which an alignment error occurs.

A resist having a predetermined shape is used for patterning for forming the pad polycrystalline silicon layer 110 uses. However, in formation of the resist, an alignment error to the common contact hole 109 may occurs in a resist 113. In such a case, when the resistance polycrystalline silicon layer 112 and the pad polycrystalline silicon layer 110 are etched by using the resist 113 as a mask, etching is performed along one side surface of the resist 113 offset from a predetermined position.

According to the manufacturing method described above, before the resist 113 is formed, the side wall 111 serving as a stopper side wall is formed in the common contact hole 109. For this reason, even if an alignment error in the resist 113 occurs, the side wall 111 serving as a stopper side wall functions as an etching stopper. As a result, even if the resistance polycrystalline silicon layer 112 is over-etched, the semiconductor substrate 101 is not etched.

Therefore, a reduction in yield caused by the alignment error of the resist 113 to the common contact hole 109 is suppressed. In addition, since a design margin which is set in the prior art to reduce a defect caused by an alignment error is not required, the size of an SRAM cell can be reduced.

In the conventional manufacturing method, as described above, the substrate may be etched by the over-etching. Thus, data leakage from the storage node occurs.

Figure 10:
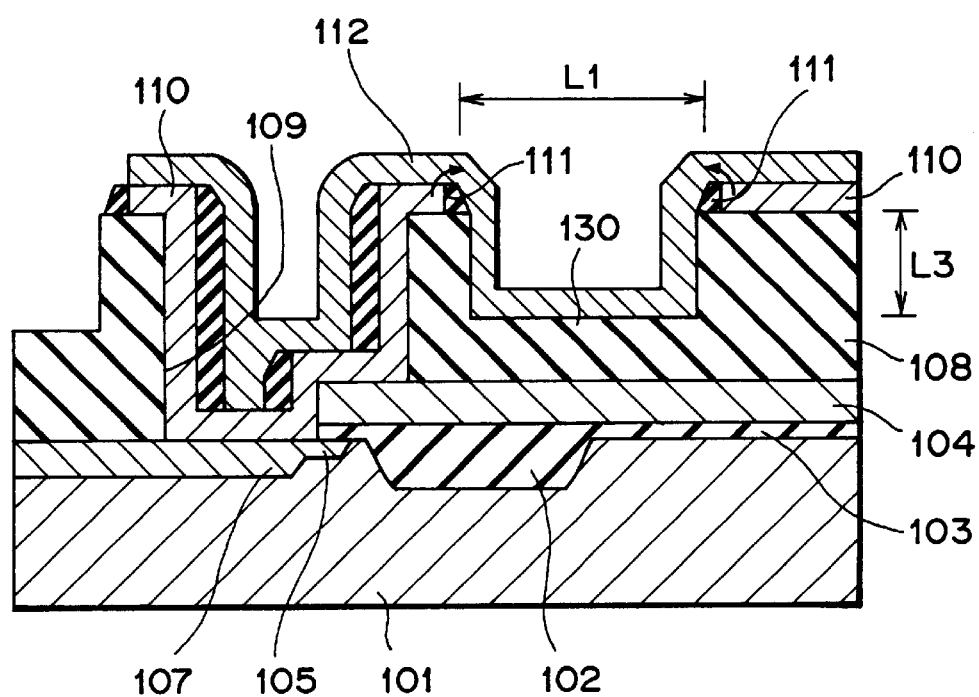
FIG. 10 is a sectional view showing a semiconductor device according to a second embodiment of the present invention.

A second embodiment will be described below. In the second embodiment, a load resistor is designed to be longer than that in the first embodiment. FIG. 10 is a sectional view showing a semiconductor device according to the second embodiment of the present invention. The same reference numerals as in the first embodiment shown in FIG. 7 denote the same parts in the second embodiment shown in FIG. 10, and a description thereof will be omitted.

In the second embodiment, a recessed portion 130 having a depth of L3 is formed in a region matching a load resistor of an interlayer insulating film 108. The resistance polycrystalline silicon layer 112 is formed along the inner surface of the recessed portion 130.

In the second embodiment arranged as described above, the resistor length of the load resistor increases by a length corresponding to the etching depth of the interlayer insulating film 108, i.e., a length corresponding to the depth L3 of the recessed portion 130. Therefore, the resistor length in the second embodiment is represented by "L1+L3×2", which is larger than the resistor length L1 in the first embodiment by a length twice the depth L3.

Therefore, according to the second embodiment, the degree of design freedom of the load resistor becomes high because the resistor length increases. A resistance having higher stability can also be obtained. In addition, even if the lateral length L1 of the load resistor is shortened, a sufficient resistor length can be secured. For this reason, the size of an SRAM cell can be reduced in size.

A method of manufacturing a semiconductor device according to the second embodiment will be described below.

As shown in FIGS. 8A to 8G, the steps performed until a pad polycrystalline silicon layer 110 having a desired shape are performed by a similar manner as that of the steps in the first embodiment.

A nitride film is formed on the entire surface of the resultant structure, for example, by a CVD method or a similar method. Then the nitride film is anisotropically etched, as shown in FIG. 8H, to form a side wall 111.

Thereafter, the interlayer insulating film 108 is etched by using the pad polycrystalline silicon layer 110 and the side wall 111 as a mask, so that the recessed portion 130 is formed. As in the first embodiment, the resistance polycrystalline silicon layer 112 is formed.

Thereafter, an interlayer insulating film (not shown) is formed and subjected to predetermined thermal treatment and to form a wiring layer (not shown) including a contact and a bit line and a passivation film (not shown). With the steps described above, an SRAM cell having the structure shown in FIG. 10 is obtained.

What is claimed is:
1. A semiconductor device, comprising:
a high resistance load type static random access memory cell, said high resistance load type static random access memory cell comprising:
a low resistance polysilicon layer, wherein a portion of said low resistance polysilicon layer provides interior wiring;
a high resistance polysilicon layer, wherein a portion of said high resistance polysilicon layer provides a resistance region having a predetermined length, said high resistance polysilicon layer provided on said low resistance polysilicon layer except for said resistance region, said high resistance polysilicon layer contacting only the upper surface of said low resistance polysilicon layer, and said resistance region disposed above a diffusion region of an MOS transistor; and
a side wall spacer provided at a side surface of said low resistance polysilicon layer, said side wall spacer interposed between said low resistance polysilicon layer and said high resistance polysilicon layer.
2. A semiconductor device according to claim 1, wherein said high resistance polysilicon layer and said low resistance polysilicon layer are in contact with each other in a direction of depth.
3. A semiconductor device according to claim 1, wherein said high resistance load type static random access memory cell further comprises a contact hole provided in an interlayer insulating film, said low resistance polysilicon layer being partially provided in said contact hole.
4. A semiconductor device according to claim 1, wherein said high resistance load type static random access memory cell further comprises a recessed portion provided in said interlayer insulating film, said high resistance polysilicon layer being provided along an inner surface of said recessed portion.

5. A semiconductor device according to claim 1, wherein said high resistance polysilicon layer comprises a polycrystalline film.

6. A semiconductor device according to claim 1, wherein said low resistance polysilicon layer comprises a polycrystalline silicon film.

7. A semiconductor device according to claim 1, wherein said side wall spacer comprises at least one insulating film selected from a group consisting of a nitride film and an oxide film.

8. A semiconductor device according to claim 1, wherein said interlayer insulating film comprises silica glass and boron.

9. A semiconductor device according to claim 8, wherein said interlayer insulating film further comprises phosphorus.

10. A semiconductor device according to claim 1, wherein said interlayer insulating film comprises silica glass and phosphorus.

11. A semiconductor device according to claim 1, wherein said interlayer insulating film has a thickness of at least 3000 Å.

12. A semiconductor device according to claim 1, wherein the impurity concentration of said low resistance polysilicon layer is at least $1\times10^{-15}$ cm$^{-2}$.

13. A semiconductor device according to claim 12, wherein said impurity is phosphorus.

14. A semiconductor device according to claim 1, wherein said low resistance polysilicon layer has a thickness of at least 300 Å.

15. A semiconductor device, comprising:
- a static random access memory cell, said static random access memory cell comprising:
  - a metal oxide semiconductor field effect transistor;
  - an interlayer insulating film provided on said metal oxide semiconductor field effect transistor;
  - a first conductive wiring provided on said interlayer insulating film;
  - a second conductive wiring;
  - a load resistor conductive layer provided on said interlayer insulating film and connected to said first conductive wiring, said load resistor conductive layer being connected to a gate electrode of said metal oxide semiconductor field effect transistor by said second conductive wiring, the resistance of said second conductive wiring being lower than the resistance of said load resistor conductive layer;
  - a first side wall spacer provided between said load resistor conductive layer and said first conductive wiring; and
  - a second side wall spacer provided between said load resistor conductive layer and said second conductive wiring.

16. A semiconductor device according to claim 15, wherein said load resistor conductive layer and said second conductive wiring are in contact with each other in a direction of depth.

17. A semiconductor device according to claim 15, wherein said static random access memory cell comprises a contact hole provided in said interlayer insulating film, said second conductive wiring being partially provided in said contact hole.

18. A semiconductor device according to claim 15, wherein said static random access memory cell further comprises a recessed portion provided in said interlayer insulating film, said load resistor conductive layer being provided along an inner surface of said recessed portion.

19. A semiconductor device according to claim 15, wherein said load resistor conductive layer comprises a polycrystalline film.

20. A semiconductor device according to claim 15, wherein said first conductive wiring comprises a polycrystalline silicon film.

21. A semiconductor device according to claim 15, wherein said first and second side wall spacers comprise at least one insulating film selected from a group consisting of a nitride film and an oxide film.

* * * * *